United States Patent
Tang

(10) Patent No.: US 10,347,839 B2
(45) Date of Patent: Jul. 9, 2019

(54) MANUFACTURING METHODS OF DISPLAY PANELS

(71) Applicant: Wuhan China Star Optoelectronics Technology Co., Ltd., Wuhan, Hubei (CN)

(72) Inventor: Yuejun Tang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 209 days.

(21) Appl. No.: 15/328,453

(22) PCT Filed: Dec. 28, 2016

(86) PCT No.: PCT/CN2016/112664
§ 371 (c)(1),
(2) Date: Jan. 23, 2017

(87) PCT Pub. No.: WO2018/119752
PCT Pub. Date: Jul. 5, 2018

(65) Prior Publication Data
US 2018/0294411 A1    Oct. 11, 2018

(51) Int. Cl.
| H01L 21/00 | (2006.01) |
| H01L 51/00 | (2006.01) |
| G02F 1/1341 | (2006.01) |
| G02F 1/1339 | (2006.01) |
| H01L 51/52 | (2006.01) |

(Continued)

(52) U.S. Cl.
CPC ............ *H01L 51/003* (2013.01); *B32B 17/06* (2013.01); *B32B 43/006* (2013.01); *G02F 1/1333* (2013.01); *G02F 1/1339* (2013.01); *G02F 1/1341* (2013.01); *H01L 51/5253* (2013.01); *H01L 51/56* (2013.01);
(Continued)

(58) Field of Classification Search
CPC .... G02F 1/1333; G02F 1/1339; G02F 1/1341; H01L 51/56; H01L 51/5253; H01L 51/1003
See application file for complete search history.

(56) References Cited

U.S. PATENT DOCUMENTS

2012/0081640 A1    4/2012  Kim

FOREIGN PATENT DOCUMENTS

| CN | 203589037 U | 5/2014 |
| CN | 103995377 A | 8/2014 |

(Continued)

OTHER PUBLICATIONS

International Search Report, Chinese Patent Office, dated Sep. 26, 2017.

*Primary Examiner* — Richard A Booth
(74) *Attorney, Agent, or Firm* — Andrew C. Cheng

(57) ABSTRACT

The present disclosure relates to a manufacturing method of display panels. The method includes providing at least two glass substrate having a predetermined dimension, configuring the glass substrate to be spaced apart from a supporting substrate, configuring a bonding area on the glass substrate, conducting a cell-formation process or a package process of the display panel, and stripping the supporting substrate. In this way, the thicker supporting substrate is configured to support the glass substrate so as to avoid two ends of the thinner glass substrate from dropping and curing, which enhances the convenience and the precision of the manufacturing process of the display panel.

4 Claims, 3 Drawing Sheets

(51) Int. Cl.
  *B32B 43/00* (2006.01)
  *H01L 51/56* (2006.01)
  *G02F 1/1333* (2006.01)
  *B32B 17/06* (2006.01)

(52) U.S. Cl.
  CPC .................... *B32B 2457/20* (2013.01); *G02F 2001/133302* (2013.01); *G02F 2001/133354* (2013.01)

(56) References Cited

FOREIGN PATENT DOCUMENTS

| | | |
|---|---|---|
| CN | 104425773 A | 3/2015 |
| CN | 106154609 A | 11/2016 |

MANUFACTURING METHODS OF DISPLAY PANELS

BACKGROUND OF THE INVENTION

1. Field of the Invention

The present disclosure relates to display panel manufacturing technology, and more particularly to a manufacturing method of display panels, and further particularly to a manufacturing method of liquid crystal display panel and organic electroluminescent display panels.

2. Discussion of the Related Art

Display devices are developed with a thin and light trend, in particularly, users demand thin-type electronic devices have been increased. Flat display devices, such as liquid crystal devices (LCDs) or organic light emitting diode (OLED) displays adopted in portable electronic devices are required to have a thinner thickness and a lighter weight so as to improve the portability of the electronic devices. In addition, with respect to the large-scale electronic products, such as TV, thin and light display devices may save the space to provide more comfortable user experience.

With respect to flat display devices, usually, a glass substrate is adopted to be the carrier of other display components, and the glass substrate is the one with biggest weight. In order to reduce the thickness and the weight of the flat display devices, the most effective way is to reduce the thickness the weight of the glass substrate. However, thinner glass substrate may be easily bent, and may have drooping or curving issues during the manufacturing process. There are two ways to reduce the thickness and the weight of the glass substrate. First, the glass substrate is etched. Second, a lighter and thinner glass substrate is adopted. With respect to the first solution, after the display panel is assembled, additional etching process is adopted to reduce the thickness and the weight of the glass substrate. The shortcoming of this solution is if the etching process fails, the manufacturing cost is greatly increased. With respect to the second solution, the thinner glass substrate may be bent, especially for large-scale glass substrate, and also the drooping and curving issues. In addition, when the glass substrate is transmitted, even small crash may cause the glass substrate to be bent when the glass substrate is loaded or unloaded, which damages the glass substrate.

SUMMARY

In one aspect, a manufacturing method of display panels includes: providing at least two glass substrate having a predetermined dimension; configuring the glass substrate to be spaced apart from a supporting substrate; configuring a bonding area on the glass substrate; conducting a cell-formation process or a package process of the display panel; stripping the supporting substrate.

Wherein the supporting substrate is made by glass, and the supporting substrate has a thickness in a range from 0.5 mm to 1 mm, and the thickness of the glass substrate is in a range from 0.05 mm to 0.2 mm.

Wherein the step of configuring the glass substrate on the supporting substrate further includes: configuring the supporting substrate and the glass substrates to contact with each other so as to bond the supporting substrate with the glass substrates under vacuum condition, or bonding the supporting substrate and the glass substrate together via adhesive.

Wherein the method further includes: configuring a supporting ball, and the supporting ball is configured to maintain a cell gap during the cell-formation process of the display panel.

Wherein the step of stripping the supporting substrate further includes: adopting fluorine to conduct a plasma process on the supporting substrate; or configuring a protrusive pattern on a surface of the supporting substrate in advance, and injecting air to a gap between the supporting substrate and the glass substrate via an air injecting device.

In one aspect, a manufacturing method of display panels includes: providing at least two top glass substrates and two bottom glass substrates having predetermined dimension; configuring the bottom glass substrate to be spaced apart from the bottom supporting substrate, and configuring the top glass substrate to be spaced apart from the top supporting substrate, wherein each of the bottom glass substrates corresponds to one top glass substrate; forming an array layer, a supporting ball, and a bonding area on the bottom glass substrate, and forming a photo-resistor layer on the top glass substrate; aligning the top supporting substrate and the bottom supporting substrate such that the supporting ball abuts against the top supporting substrate, and filling a liquid crystal layer between the photo-resistor layer and the array layer; and stripping the top supporting substrate and the bottom supporting substrate, and removing the supporting ball.

Wherein the top supporting substrate and/or the bottom supporting substrate are made by glass, and a thickness of the bottom supporting substrate and the top supporting substrate is in a range from 0.5 mm to 1 mm; and the thickness of the bottom glass substrate and/or the top glass substrate is in a range from 0.05 mm to 0.2 mm.

Wherein the step of configuring the bottom glass substrate to be on the bottom supporting substrate further includes: configuring the bottom supporting substrate and the bottom glass substrates to contact with each other so as to bond the bottom supporting substrate with the bottom glass substrates under vacuum condition, or bonding the bottom supporting substrate and the bottom glass substrate together via adhesive; and the step of configuring the top glass substrate to be on the top supporting substrate further includes: configuring the top supporting substrate and the top glass substrates to contact with each other so as to bond the top supporting substrate with the top glass substrates under vacuum condition, or bonding the top supporting substrate and the top glass substrate together via adhesive.

Wherein the step of stripping the bottom supporting substrate further includes: conducting a plasma process on the bottom supporting substrate, or configuring a protrusive pattern on a surface of the bottom supporting substrate in advance, and injecting air to a gap between the bottom supporting substrate and the bottom glass substrate via an air injecting device; wherein the step of stripping the top supporting substrate further includes: conducting a plasma process on the top supporting substrate, or configuring a protrusive pattern on a surface of the top supporting substrate in advance, and injecting air to a gap between the top supporting substrate and the top glass substrate via an air injecting device.

In another aspect, a manufacturing method of organic light emitting diode (OLED) display panels includes: providing at least two bottom glass substrates having predetermined dimension; configuring the bottom glass substrate to be spaced apart from a bottom supporting substrate; configuring an organic lighting layer and a bonding area on the bottom glass substrate; forming a package layer on the organic lighting layer; and stripping the bottom supporting substrate.

Wherein the bottom supporting substrate is made by glass, and the bottom supporting substrate has a thickness in a range from 0.5 mm to 1 mm, and the thickness of the bottom glass substrate is in a range from 0.05 mm to 0.2 mm.

Wherein the step of configuring the bottom glass substrate on the bottom supporting substrate further includes: configuring the bottom supporting substrate and the bottom glass substrates to contact with each other so as to bond the bottom supporting substrate with the bottom glass substrates under vacuum condition, or bonding the bottom supporting substrate and the bottom glass substrate together via adhesive.

Wherein the step of stripping the bottom supporting substrate further includes: conducting a plasma process on the bottom supporting substrate, or configuring a protrusive pattern on a surface of the bottom supporting substrate in advance, and injecting air to a gap between the bottom supporting substrate and the bottom glass substrate via an air injecting device.

In view of the above, the thicker supporting substrate is configured to support the glass substrate so as to avoid two ends of the thinner glass substrate from dropping and curing, which enhances the convenience and the precision of the manufacturing process of the display panel.

BRIEF DESCRIPTION OF THE DRAWINGS

Embodiments of the invention will now be described more fully hereinafter with reference to the accompanying drawings, in which embodiments of the invention are shown.

DETAILED DESCRIPTION OF THE EMBODIMENTS

Figure 1A:
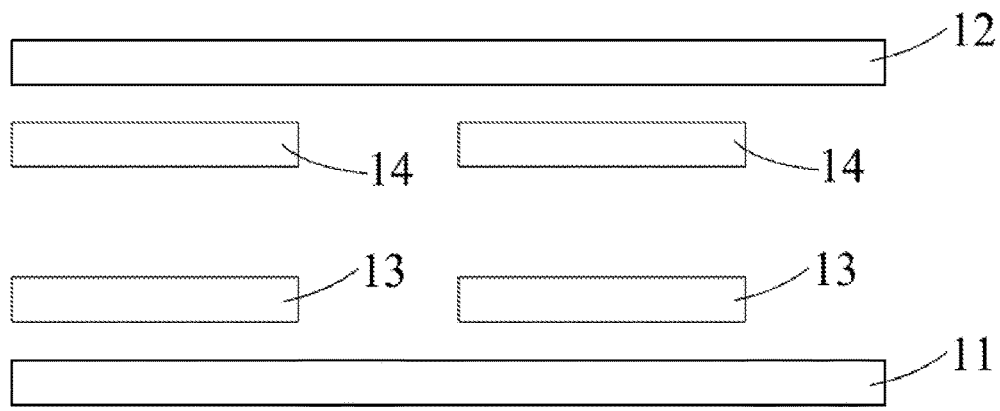
FIGS. 1A-1E are schematic views of the manufacturing method of the liquid crystal display panel in accordance with a first embodiment.

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

FIGS. 1A-1E are schematic views of the manufacturing method of the liquid crystal display panel in accordance with a first embodiment.

The manufacturing method includes the following steps.

In step 1, referring to FIG. 1A, providing a bottom supporting substrate 11 and a top supporting substrate 12, and providing two down glass substrates 13 and two top glass substrates 14 having a predetermined dimension. It is to be noted that the numbers of the top glass substrates 14 and the down glass substrates 13 may be configured in accordance with real scenario, that is, the number of the top glass substrates 14 and the down glass substrates 13 is not limited to two.

The bottom supporting substrate 11 and the top supporting substrate 12 may be made by glass, ceramics, or metal. A thickness of the bottom supporting substrate 11 and the top supporting substrate 12 is in a range from 0.5 mm to 1 mm. In the embodiment, the bottom supporting substrate 11 and the top supporting substrate 12 are made by glass, and the thickness of the bottom supporting substrate 11 and the top supporting substrate 12 is 0.7 mm.

The step of obtaining the down glass substrates 13 and two top glass substrates 14 having a predetermined dimension further includes: cutting a large-scale glass in accordance with a predetermined dimension to form the down glass substrates 13 and the top glass substrates 14.

Figure 1B:
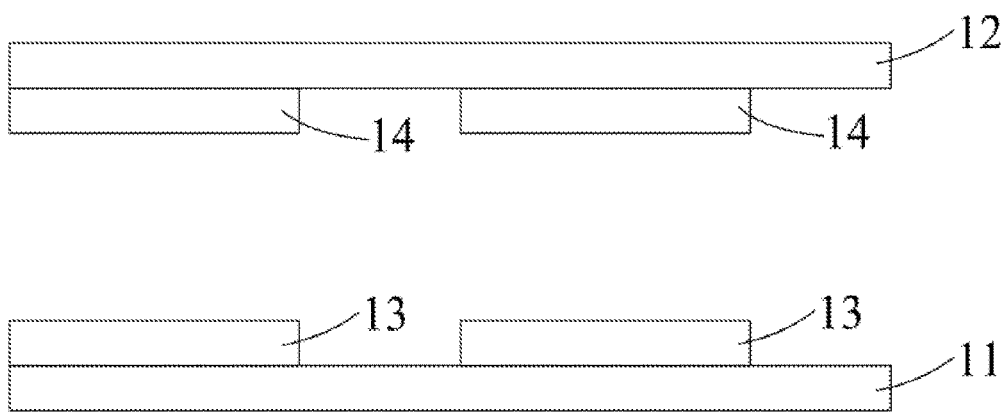

In step 2, referring to FIG. 1B, configuring the down glass substrates 13 to be spaced apart from the bottom supporting substrate 11, and configuring the top glass substrates 14 to be spaced apart from the top supporting substrate 12.

The down glass substrates 13 and the top glass substrates 14 are thinner, and the down glass substrates 13 and the top glass substrates 14 have the thickness ranging from 0.05 mm to 0.4 mm, preferably, in a range from 0.1 mm to 0.15 mm. The thinner glass substrate, such as the down glass substrates 13 and the top glass substrates 14, are configured to be above the thicker supporting substrate, such as the bottom supporting substrate 11 and the 12 and the 12. That is, the thicker supporting substrate is configured to support the glass substrate so as to avoid two ends of the thinner glass substrate from dropping and curing, which enhances the convenience and the precision of the manufacturing process of the display panel.

The step of configuring the down glass substrates 13 and top glass substrates 14 respectively on the bottom supporting substrate 11 and the top supporting substrate 12 further includes: 1) bonding the supporting substrate and the glass substrate via adhesive forces, such as static electricity, vacuum forces, or surface tension forces, under a vacuum condition; 2) the supporting substrate and the glass substrate are bonded together via adhesive.

Figure 1C:
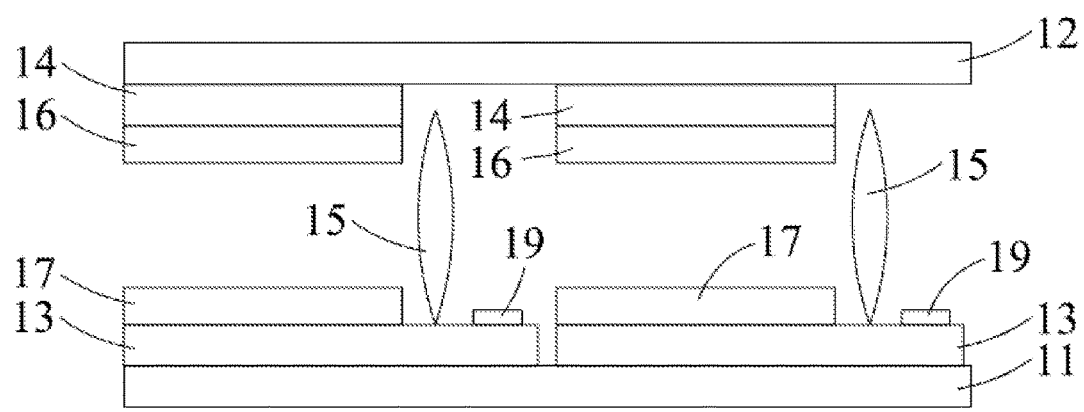

In step 3, referring to FIG. 1C, configuring a supporting ball 15, an array layer 17, and a bonding area 19. Correspondingly, a photo-resistor layer 16 is configured on the top glass substrates 14. It is to be noted that other display components may be configured on the down glass substrates 13 and the top glass substrates 14. In addition, though the bonding area 19 and the supporting ball 15 are conventionally configured in a non-display area of the liquid crystal panel, the bonding area 19 may also not equivalent to the non-display area of the liquid crystal panel.

In the embodiment, the supporting ball 15 may be, but not limited to, a Si ball.

Figure 1D:
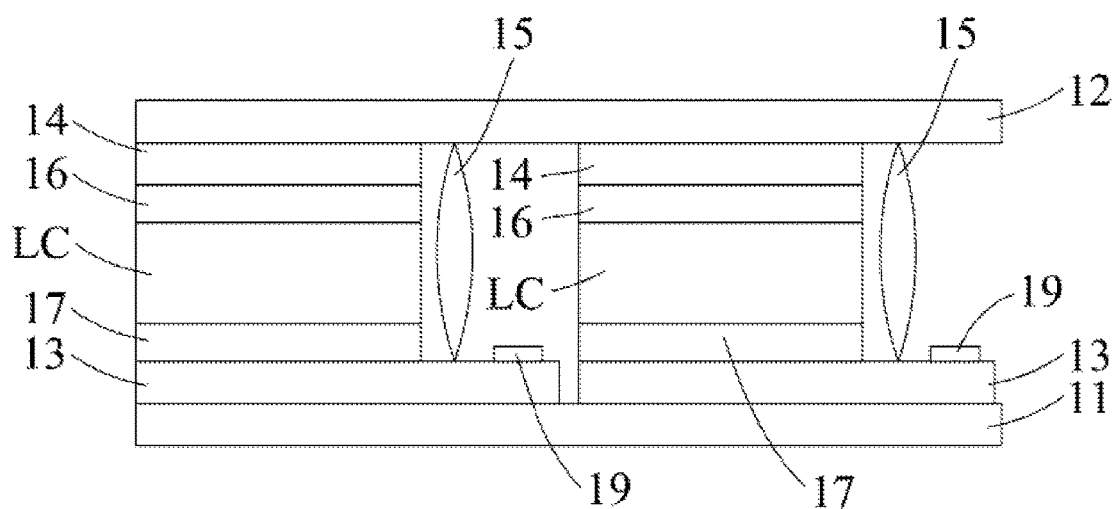

In step 4, referring to FIG. 1D, aligning the top supporting substrate 12 and the 11 and the 11 such that the supporting ball 15 abuts against the top supporting substrate 12, and filling a liquid crystal layer (LC) between the photo-resistor layer 16 and the array layer 17 to finish a cell-formation process of the liquid crystal panel.

The top supporting substrate 12 and the bottom supporting substrate 11 not only can protect the down glass substrates 13 and the top glass substrates 14, but also the display components between the top glass substrates 14 and the down glass substrates 13. In addition, the top supporting substrate 12 and the bottom supporting substrate 11 also enhances the operational convenience and alignment precision.

In addition, the supporting ball 15 is configured to maintain a distance between the top glass substrates 14 and the down glass substrates 13 and the distance between the top supporting substrate 12 and the bottom supporting substrate 11. Before being cured, the supporting ball 15 maintains the distances between two sides of the seal of the top glass substrates 14 and the down glass substrates 13 to be the same or to be very close to one another. After being cured, the thicknesses of the internal and the external edges may be the same or may be close to one another, which reduces the color differences occurring in the edge portion.

Figure 1E:
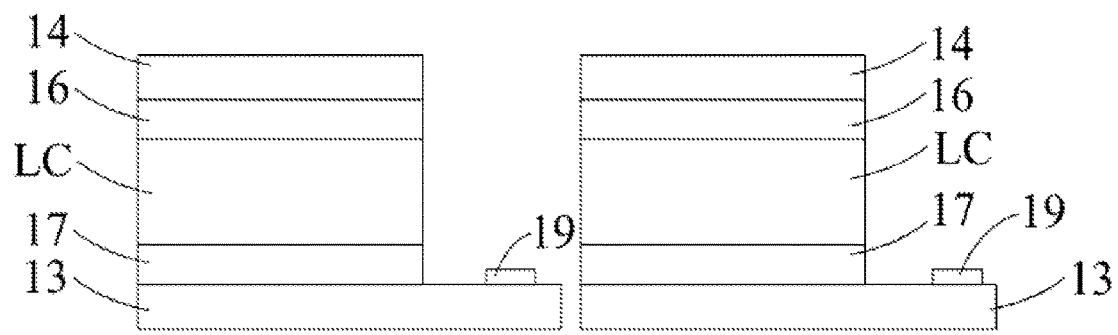

In step 5, referring to FIG. 1E, stripping the top supporting substrate 12 and the bottom supporting substrate 11 and removing the supporting ball 15.

The step of stripping the top supporting substrate 12 and the bottom supporting substrate 11 includes: 1) adopting fluorine to conduct a plasma process on the supporting substrate; 2) configuring a protrusive pattern on a surface of the supporting substrate in advance to decrease the adhesive force between the glass substrate and the supporting substrate. Also, an air injecting device (not shown) is adopted to inject the air to the gap between the supporting substrate and the glass substrate so as to strip the supporting substrate.

In view of the above, the thinner top supporting substrate 12 and the down glass substrates 13 are configured to provide an uniform thickness of the liquid crystal panel. Also, the surface of the cell is flat and smooth.

FIGS. 2A-2E are schematic views of the manufacturing method of the liquid crystal display panel in accordance with a second embodiment.

The method includes the following steps.

Figure 2A:
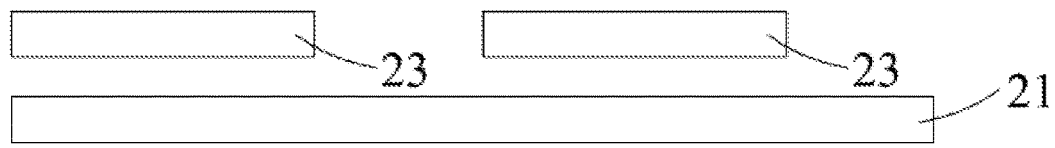
FIGS. 2A-2E are schematic views of the manufacturing method of the liquid crystal display panel in accordance with a second embodiment.

In step 1, referring to FIG. 2A, providing a top glass substrate 21 and two down glass substrates 23. It is to be noted that the numbers of the down glass substrates 23 may be configured in accordance with real scenario, that is, the number of the down glass substrates 23 is not limited to two.

The bottom supporting substrate 21 and the top supporting substrate 22 may be made by glass, ceramics, or metal. A thickness of the bottom supporting substrate 21 and the top supporting substrate 22 is in a range from 0.5 mm to 1 mm. In the embodiment, the bottom supporting substrate 21 and the top supporting substrate 22 are made by glass, and the thickness of the bottom supporting substrate 21 and the top supporting substrate 22 is 0.7 mm.

The step of obtaining the two down glass substrates 23 having a predetermined dimension further includes: cutting a large-scale glass in accordance with a predetermined dimension to form the two down glass substrates 23.

Figure 2B:
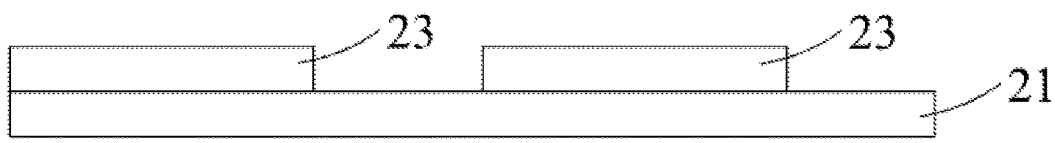

In step 2, referring to FIG. 2B, configuring the down glass substrates 23 to be spaced apart from the bottom supporting substrate 21.

The down glass substrates 23 is thinner, and has a thickness ranging from 0.1 mm to 0.25 mm. The thinner down glass substrates 23 is configure above the bottom supporting substrate 21 such that the thicker bottom supporting substrate 21 may support the down glass substrates 23. In addition, two ends of the thinner down glass substrates 23 are prevented from dropping and curving, which enhances the convenience and the precision of the manufacturing process of the display panel.

The step of configuring the down glass substrates 23 on the bottom supporting substrate 21 further includes: 1) configuring the bottom supporting substrate 21 and the down glass substrates 23 to contact with each other so as to bond the bottom supporting substrate 21 with the down glass substrates 23 under vacuum condition. The bottom supporting substrate 21 and the down glass substrates 23 are bonded via adhesive forces, such as static electricity, vacuum forces, or surface tension forces; 2) the bottom supporting substrate 21 and the down glass substrates 23 are bonded together via adhesive.

Figure 2C:
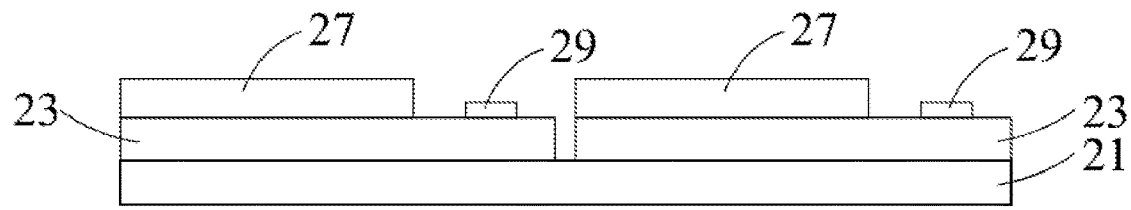
Figure 2D:
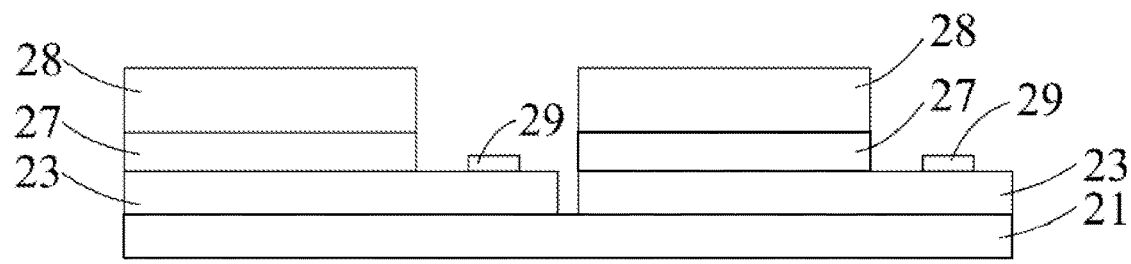

In step 3, referring to FIG. 2C, configuring an organic lighting layer 27 and a bonding area 29. It is to be noted that other display components may be configured on the down glass substrates 23. In addition, though the bonding area 29 generally equivalent to a non-display area of the liquid crystal panel, the bonding area 29 may also not equivalent to the non-display area of the liquid crystal panel.

In step 4, referring to FIG. 1D, configuring a package layer 28 above the organic lighting layer 27 to isolate water and oxygen. The package layer 28 may be a glass cover or a thin-film package layer.

Figure 2E:
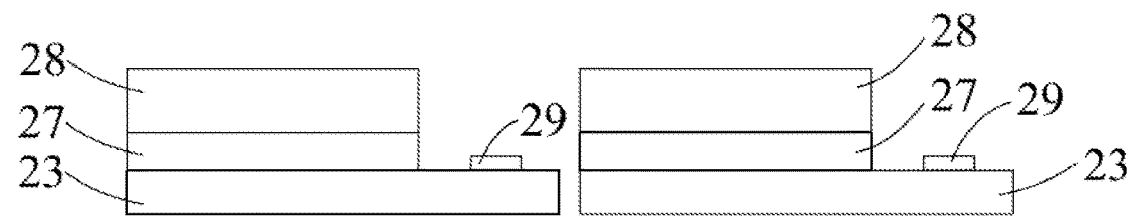

In step 5, referring to FIG. 2E, stripping the bottom supporting substrate 21.

The step of stripping the bottom supporting substrate 11 includes: 1) adopting fluorine to conduct a plasma process on the bottom supporting substrate 21; 2) configuring a protrusive pattern on a surface of the bottom supporting substrate 21 in advance to decrease the adhesive force between the down glass substrates 23 and the bottom supporting substrate 21. Also, an air injecting device (not shown) is adopted to inject the air to the gap between the down glass substrates 23 and bottom supporting substrate 21 so as to strip the supporting substrate.

In view of the above, the thinner down glass substrates 23 is configured to provide an uniform thickness of the liquid crystal panel. Also, the surface of the cell is flat and smooth.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A manufacturing method of organic light emitting diode (OLED) display panels, comprising:
    providing at least two bottom glass substrates having predetermined dimension;
    configuring the bottom glass substrates to be spaced apart from a bottom supporting substrate, and a thickness of the bottom glass substrate is less than a thickness of the bottom supporting substrate;
    configuring an organic lighting layer and a bonding area on the bottom glass substrate;
    forming a package layer on the organic lighting layer; and
    stripping the bottom supporting substrate.

2. The manufacturing method as claimed in claim 1, wherein the bottom supporting substrate is made by glass, and the bottom supporting substrate has a thickness in a range from 0.5 mm to 1 mm, and the thickness of the bottom glass substrate is in a range from 0.05 mm to 0.2 mm.

3. The manufacturing method as claimed in claim 1, wherein the step of configuring the bottom glass substrate on the bottom supporting substrate further comprises:
    configuring the bottom supporting substrate and the bottom glass substrates to contact with each other so as to bond the bottom supporting substrate with the bottom glass substrates under vacuum condition, or bonding the bottom supporting substrate and the bottom glass substrate together via adhesive.

4. The manufacturing method as claimed in claim 1, wherein the step of stripping the bottom supporting substrate further comprises:

conducting a plasma process on the bottom supporting substrate, or configuring a protrusive pattern on a surface of the bottom supporting substrate in advance, and injecting air to a gap between the bottom supporting substrate and the bottom glass substrate via an air injecting device.

\* \* \* \* \*